United States Patent
Bruchhaus et al.

(10) Patent No.: US 6,818,503 B2
(45) Date of Patent: Nov. 16, 2004

(54) METHOD FOR FABRICATING A SEMICONDUCTOR MEMORY DEVICE

(75) Inventors: Rainer Bruchhaus, Kanawaga-Pref (JP); Gerhard Enders, Olching (DE); Walter Hartner, Glen Allen, VA (US); Igor Kasko, München (DE); Matthias Krönke, Dresden (DE); Thomas Mikolajick, München (DE); Nicolas Nagel, Naka-ku Yokohama (JP); Michael Röhner, München (DE); Volker Weinrich, Paris (FR)

(73) Assignee: Infineon Technologies AG, Munich (DE)

( * ) Notice: Subject to any disclaimer, the term of this patent is extended or adjusted under 35 U.S.C. 154(b) by 63 days.

(21) Appl. No.: 10/186,607

(22) Filed: Jul. 1, 2002

(65) Prior Publication Data

US 2003/0060002 A1 Mar. 27, 2003

(30) Foreign Application Priority Data

Jun. 29, 2001 (DE) .......................................... 101 31 491

(51) Int. Cl.⁷ ......................................... H01L 21/8242
(52) U.S. Cl. ......................... 438/256; 438/399; 438/672
(58) Field of Search ................................. 438/253, 256, 438/396, 399, 643, 672, 675

(56) References Cited

U.S. PATENT DOCUMENTS 6,555,431 B1 * 4/2003 Xing et al. .................. 438/253

FOREIGN PATENT DOCUMENTS

| DE | 195 43 539 C1 | 4/1997 |
| DE | 198 34 649 C1 | 3/2000 |
| JP | 05 343 615 A | 12/1993 |

* cited by examiner

*Primary Examiner*—Amir Zarabian
*Assistant Examiner*—Pamela E Perkins
(74) *Attorney, Agent, or Firm*—Laurence A. Greenberg; Werner H. Stemer; Ralph E. Locher

(57) ABSTRACT

A method of fabricating semiconductor memory devices is simplified by providing at least some plug regions, which are provided for contacting storage capacitor devices of a capacitor configuration, such that the plug regions have in each case a region that is elevated above the surface region of a passivation region.

25 Claims, 8 Drawing Sheets

METHOD FOR FABRICATING A SEMICONDUCTOR MEMORY DEVICE

BACKGROUND OF THE INVENTION

Field of the Invention

The invention relates to a method for fabricating a semiconductor memory device.

In modern semiconductor memory devices, in particular in FeRAMs (Ferro-Electric Random Access Memories) or other memory devices, a semiconductor substrate or the like, a passivation region and/or a surface region thereof are formed with a CMOS (Complementary Metal Oxide Semiconductor) structure. Furthermore, a capacitor configuration including a plurality of capacitor devices serving as storage elements is provided in the region of the semiconductor substrate, in a passivation region and/or in a portion thereof. First and second contact regions or plug regions are formed for contacting the capacitor devices of the capacitor configurations to the CMOS structure.

An objective of the ongoing development of modern semiconductor memory technologies is, inter alia, the formation of the highest and most extensive integration density possible. Furthermore, it is a further objective to configure fabrication methods in a manner that is as simple and operationally economically expedient as possible.

What is problematic in the case of existing fabrication methods is that a plurality of the components provided in modern semiconductor memory devices can be produced and patterned only in the context of separate work steps that are to be performed one after the other. This applies in particular to the plurality of different contact regions or plug regions and the contact connection thereof to the storage capacitors, on the one hand, and to the underlying CMOS structure, on the other hand.

SUMMARY OF THE INVENTION

It is accordingly an object of the invention to provide a method for fabricating a semiconductor memory device which overcomes the above-mentioned disadvantages of the heretofore-known methods of this general type and which can be performed in a simple manner and in which, in particular, different process steps can be performed jointly whilst at the same time ensuring the functional reliability of the components.

With the foregoing and other objects in view there is provided, in accordance with the invention, a method for fabricating a semiconductor memory device, the method includes the steps of:

forming a CMOS structure in a semiconductor substrate region and/or a passivation region and/or a surface region of the semiconductor substrate region and/or a surface region of the passivation region;

forming a capacitor configuration in the semiconductor substrate region and/or the passivation region and/or the surface region of the semiconductor substrate region and/or the surface region of the passivation region such that the capacitor configuration includes a plurality of capacitor devices serving as storage elements;

providing at least first and second contact regions for contacting the capacitor devices to the CMOS structure;

forming a first electrode device as a bottom electrode device, a second electrode device as a top electrode device and a dielectric between the first electrode device and the second electrode device for each of the capacitor devices; and forming at least some of the first and second contact regions with respective elevated regions in the passivation region such that the elevated regions are elevated above the surface region of the passivation region.

In other words, a method for fabricating a semiconductor memory device is provided, in which a semiconductor substrate, a passivation region and/or a surface region thereof are formed with a CMOS structure; in which a capacitor configuration of a plurality of capacitor devices serving as storage elements is formed in the region of the semiconductor substrate, the passivation region and/or the surface region thereof; in which at least first and second contact regions or plug regions are provided for the contact connection of the capacitor devices to the CMOS structure; in which a first, bottom electrode device, a second, top electrode device and a dielectric formed in each case between the electrode devices are provided for each of the capacitor devices, and in which at least some of the first and/or second contact regions or plug regions, in the passivation region, are formed with a region in each case elevated above the surface region of the passivation region.

The method for fabricating a semiconductor memory device according to the invention is distinguished by virtue of the fact that at least some of the first and/or second contact regions or plug regions, in the first passivation region, are formed with a region in each case elevated above the surface region of the passivation region.

It is thus a basic idea of the present invention, in a fabrication method for semiconductor memory devices, to form the various plug regions or contact regions that are to be provided, for the contact connection of storage capacitors to the underlying CMOS structure, with elevated structures which extend beyond the surface region of a passivation region on the semiconductor substrate. In this way, a plurality of required contact connections with the contact regions or plug regions can be formed more simply because, for example, contacts that are to be incorporated into the depth of the passivation region to the plug regions and the processing thereof can be realized more simply, especially as the plug regions virtually extend in the direction toward the storage capacitors that are to be provided.

In accordance with a particularly preferred embodiment of the method according to the invention for fabricating a semiconductor memory device, it is provided that the first and second contact regions or plug regions that are to be provided are formed essentially together, in particular in a common process step, in a common and/or cascaded process sequence or the like. What is thereby achieved in an advantageous manner compared with the prior art is that the entire process sequence is carried out in a simplified manner in respect of production technology and in a shortened time.

It is thus a basic idea of the embodiment according to the invention to combine the formation of the various plug regions or contact regions that are to be provided, for contact connection of the storage capacitors to the rest of the semiconductor memory device, in particular to the underlying CMOS structure, in a single step, in a common process sequence or in a common cascaded process section, so that they are thus formed essentially simultaneously.

In this case, in an advantageous manner, it is provided, in particular, that the contact regions or plug regions are formed and patterned after the formation of the passivation region. This ensures that the possibly sensitive underlying semiconductor circuit for the semiconductor memory device, namely the CMOS structure, once it has been produced, can be processed further in a protected manner without being further influenced.

It is furthermore preferred that the elevated regions of the first and/or second contact regions or plug regions are formed by at least partial and/or selective masking and/or etching back of the first passivation region provided with the first and/or second contact regions or plug regions and/or of the first and/or second contact regions or plug regions.

Thus, in accordance with this embodiment, firstly either the totality of the contact regions or plug regions is introduced into the existing passivation region by the formation of cutouts and subsequent filling. Or, alternatively, firstly the contact regions or plug regions are constructed at predetermined positions and are then subsequently embedded In a corresponding passivation region. In any event, however, the total configuration including passivation region and contact regions or plug regions formed therein is patterned by a corresponding etching-back operation in conjunction with a lithographic step, corresponding masks being formed on free surfaces according to the fundamental structure desired, so that the corresponding removal of material is effected only at the unprotected surface regions. It is thus possible, for example, also to leave plug regions unprotected, so that a correspondingly desired combination of plug regions with elevated regions and plug regions without elevated regions can be formed.

It is provided, in a further advantageous manner, that firstly the, in particular essentially horizontally extending, semiconductor substrate or the like and/or the surface region thereof and, in particular, the CMOS structure are at least partially covered and/or embedded by at least one first essentially top-located and/or essentially laterally extending passivation region made of an essentially electrically insulating material—preferably made of a silicon dioxide or the like—, in particular in an essentially two-dimensional, large- and/or whole-area manner and/or in particular with an essentially planar surface region.

In order to form the first and second contact regions or plug regions, it is provided, in accordance with a preferred embodiment of the method according to the invention, that first and second cutouts are formed in defined first and second regions or at defined first and second locations in the essentially top-located and laterally extending first passivation region. This is done, in particular, through the use of a, preferably selective and/or common, etching process or the like in conjunction with a lithography step.

The first and second plug regions are generally positioned and/or oriented with respect to the underlying semiconductor circuit and, in particular, with respect to the underlying CMOS structure of the semiconductor circuit configuration or semiconductor memory device.

Accordingly, it is preferably provided that regions essentially above source/drain regions of selection transistor devices of the CMOS structure, the devices being provided in the surface region of the semiconductor substrate, are chosen as defined first and second regions and/or as defined first and second locations.

To that end, in an advantageous manner, first and second cutouts are formed vertically at least partially as far as the level of surface regions of the source/drain regions of the selection transistor devices.

Afterward, a first material region of an essentially electrically conductive material is then deposited and/or formed. This is done in particular in a two-dimensional, conformal, large—and/or whole-area manner. In this case, in particular the first and second cutouts are in each case filled as far as the level of the surface region of the source/drain regions. As an alternative or in addition, it is also possible to effect a very generous deposition with a relatively high layer thickness, if appropriate followed by a polishing step or the like as far as the level of the surface region of the first passivation region.

Although the first and second plug regions differ with regard to their functionality—namely the contact connection of first electrode devices of the capacitor devices to the CMOS structure, on the one hand, and the contact connection of second electrode devices of the capacitor devices to the CMOS structure, on the other hand—, it is particularly advantageous if, in accordance with a preferred embodiment of the method according to the invention, the first and second contact regions or plug regions are formed essentially identically. This relates to the materials used and to the geometrical dimensions and orientations and simplifies the process sequence.

In order to form the respective capacitor devices, in each case a first, bottom electrode device, a second, top electrode device and also a dielectric formed essentially between the electrodes are provided.

A particularly space-saving embodiment results in the case of the method according to the invention by forming a capacitor configuration with an at least partly connected structure or chain structure. In this case, it is provided that at least some of the capacitor devices are contact-connected by their respective first, bottom electrode device via a first contact element, if appropriate as part of the respective plug device, to the first, bottom electrode device of another first essentially directly spatially adjacent capacitor device and by their second, top electrode device via a second contact element, if appropriate as part of the other plug device, to the second, top electrode device of another second essentially directly spatially adjacent capacitor device of the capacitor configuration.

Moreover, a particularly space-saving concept further results if at least some of the capacitor devices of the capacitor configuration are constructed essentially in the form of a stack structure.

As an alternative or in addition, a particularly advantageous application of the method according to the invention and of its embodiments results if the capacitor device is formed and/or patterned in each case in an at least partially and/or locally essentially vertically extending fashion with respect to the, in particular essentially horizontally extending, semiconductor substrate or the like of a passivation region and/or of a surface region thereof, in which case, as a result, in particular, in each case an essentially three-dimensional configuration or structure and/or a configuration or structure extending at least partially and/or locally essentially into the third dimension with respect to the, in particular essentially horizontally extending, semiconductor substrate or the like, a passivation region and/or a surface region thereof is formed and/or patterned for the respective capacitor device.

This means that, in accordance with a particularly preferred embodiment of the method according to the invention for fabricating a semiconductor memory device, the latter is formed with a vertical capacitor configuration, in which case the first and second electrode devices and also the provided dielectric in the respective capacitor device are formed and/or patterned at least partially and/or locally in an essentially vertically extending fashion in each case with respect to the, in particular essentially horizontally extending, semiconductor substrate or the like, a passivation region and/or a surface region thereof. In this case, the processing is effected in such a way that, in particular, the sequence of first electrode device, dielectric and second electrode device of the respective capacitor device of the respective capacitor configuration is formed at least partially and/or locally in an essentially horizontally extending fashion with respect to the, in particular essentially horizontally extending, semiconductor substrate or the like, a passivation region and/or a surface region thereof. This is effected in particular in a form arranged one beside the other in the surface region of the semiconductor substrate and/or a passivation region thereof.

It is precisely in the case of vertically formed structures that the elevated regions of the contact regions or plug regions afford particular advantages, both during operation and during processing of the semiconductor memory device.

In this case, it is provided that at least contact regions or plug regions that are to be contact-connected to the second, top electrode devices, in particular the second contact regions or plug regions, are formed with an elevated region in each case. In this case, it may be provided, in particular, that the respective contact regions or plug regions that are to be contact-connected to the first, bottom electrode devices, that is to say in particular the first contact regions or plug regions, are formed in a planar and flush manner—that is to say without an elevated region—with the passivation region.

However, it is also conceivable and under specific situations expedient—if appropriate in addition—to form the contact regions or plug regions that are to be contact-connected to the first, bottom electrode devices with elevated regions.

In this case, the respective elevated regions for different contact regions or plug regions may be formed identically or else differently.

In accordance with a further embodiment of the method according to the invention, it is provided that at least some of the first and/or second contact regions or plug regions that are formed with an elevated region, in particular first contact regions or plug regions that are to be contact-connected to first, bottom electrode devices, are formed at least in part with an electrically conductive barrier region. The barrier region serves, during operation and/or during processing, at least to reduce the diffusion of ambient elements toward the respective contact region or plug region, so that, under certain circumstances, conceivable chemical conversion processes, in particular corrosion, can be prevented or avoided. This procedure helps to avoid contact-connection problems in the transition from the electrode devices to the underlying CMOS structure. If appropriate, a barrier is necessary in both plug regions.

The above-presented and further aspects and advantages of the present invention furthermore emerge on account of the following remarks:

In the construction of semiconductor memory devices with storage capacitors in a chain configuration, difficulties arise with regard to the connections of top electrodes and bottom electrodes with corresponding plug regions which are formed in a surface region of a semiconductor substrate, in particular in a passivation region thereof. These difficulties relate, in particular, to the need to realize the fabrication methods with the fewest possible process steps.

A fundamental aspect of the present invention is to specify measures which enable a simplified fabrication process. This is realized in particular by virtue of the fact that it is possible to dispense with an explicit or additional contact connection of the plugs or a second plug deposition or formation.

FeRAMs have hitherto been formed only using the so-called offset principle, in the case of which top electrode and bottom electrode connections are realized via a metal of a first type or via metal planes which lie above the capacitor device. This requires both plated-though holes or vias between top and bottom electrode and the metal and contact holes between source/drain regions in the CMOS structure of selection transistor devices provided and the metal. By contrast, FeRAM structures according to the stack principle have hitherto not been commercially available.

The method according to the invention has, in particular, inter alia, the following steps:

After the transistors—the CMOS structure and the like—have been fabricated, an intermediate oxide is deposited as passivation region and planarized through the use of CMP (chemical mechanical polishing). Afterward, both the plugs which lead to the bottom electrode devices and those plugs which are intended to lead to the top electrode devices are introduced into the intermediate oxide. This is done by the etching of corresponding contact holes and by subsequent filling, e.g. with polysilicon, tungsten or the like, the surface admittedly being planarized, if appropriate, with respect to the intermediate oxide, but with a stop at a level spaced apart vertically from the passivation layer.

A crucial step then resides, for example, in the fact that either all or else only some of the plug regions or plugs are covered with corresponding masks, for example resist masks or the like, in order that the structure is subsequently etched back essentially anisotropically overall in a recess process. Corresponding elevated plugs are produced at the locations which were covered with the mask region or the resist, because removal of material largely does not take place at these locations.

This method enables numerous applications and process simplifications in the area of FeRAMs, in particular of the chain type and/or in the stack type.

In a first application possibility, after the fabrication of the elevated plugs, corresponding connections are constructed in order to form a semiconductor memory device with storage capacitors of the connected or chain type. In this case, all of the regions or only relatively short bottom electrode plugs can be protected by an oxygen barrier against oxidation, for example during the heat treatment of the ferroelectric (ferro anneal). Furthermore, it is possible then to form the electrical contact connection of the top electrode connection for example only after the annealing of the ferroelectric, in other words after the heat treatment process, so that there is no need for an oxygen barrier here because the connection to the plug region is cleaned and freed of nonconducting oxides, which may be produced during the heat treatment, directly before the contact connection.

A second application possibility involves the formation of a so-called three-dimensional or 3D structure in FeRAMs or in chain FeRAMs. The method described according to the invention is very useful here, too. In this application, too, every plug or every second plug can be coated with a corresponding oxygen barrier and then subsequently be used as bottom electrode plug region.

After the formation of the oxygen barriers, material regions for the bottom electrode and for the ferroelectric are deposited and patterned. In this case, although it is possible, in principle, for short-circuit regions to arise between the top electrode plugs and the bottom electrode plugs which are in proximity to one another, namely via the bottom electrode and via the oxygen barrier, or the corresponding material layer therefor. The top electrode plugs which are not protected by an oxygen barrier are nonetheless incipiently oxidized in a region a few nanometers thick on the surface during the heat treatment of the ferroelectric. As a result, the existing short circuit that has possibly been produced is interrupted by the oxide isolation that forms. In other words, during this fabrication method, the previously undesirable oxidation is used to prevent a short circuit.

The elevated bottom electrode plug region has a number of advantages at this location: firstly, it produces a larger capacitor area, to be precise without having to extend the required silicon surface or surface of the semiconductor substrate on the underlying wafer. This is done by virtue of the fact that the elevated region of the plug region extends into the third dimension, and thereby offers side or edge regions or areas as an additional foundation for side or edge areas—likewise extending into the third dimension—for electrode regions.

In order that the capacitance of the capacitor is maintained in the event of further miniaturization, the elevated plug can be raised and the capacitor area can thus be extended into the third dimension.

Secondly, the area between the plug region of the bottom electrodes and the oxygen barrier becomes very large if the bottom electrode plug is formed into the third dimension, that is to say into the height, to a great extent. This has the advantage that during the oxidation of the contact areas between bottom electrode plug and oxygen barrier from the side, during the heat treatment of the ferroelectric, the contact is not immediately interrupted in its entirety, rather firstly only a part of the contact area between the oxygen barrier and the plug region for the bottom electrode is exposed to oxidation. Depending on the intensity of this oxidation, the height of the bottom electrode plugs can be chosen such that after the ferroelectric annealing process, contact areas that are still adequately non-oxidized and thus electrically continuous are present between the oxygen barrier and the plug region for the bottom electrode.

Finally, the following steps are then also effected:
    deposition and patterning of the respective top electrode regions and, finally, embedding in an insulation region and end contact-connection, if appropriate via further metalization planes.

In a third application possibility, the formation of so-called vertically patterned FeRAMs or chain FeRAMs is provided. In this case, the method described above, is employed beneficially in so far as the marginal regions or edge regions of plug regions that are formed in elevated fashion are formed and employed for the formation of perpendicularly extending electrodes. Capacitors with virtually vertically extending electrode areas are fabricated in this case.

Viewed overall, an inventive step in the present fabrication method is achieved by dispensing with a second plug deposition through the use of a suitable process control, a direct connection being formed between, for example, a top electrode device and the corresponding plug, the plug for the top electrode extending precisely only as far as a surface region of a first intermediate oxide or passivation region.

Other features which are considered as characteristic for the invention are set forth in the appended claims.

Although the invention is illustrated and described herein as embodied in a method for fabricating a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In intermediate stages during the fabrication of a semiconductor memory device according to the invention, the intermediate stages being shown in diagrammatic and sectional side views in FIGS. 1–7, identical or functionally identical elements are designated by identical reference symbols, and their description is not repeated individually in detail for each figure.

Figure 1:
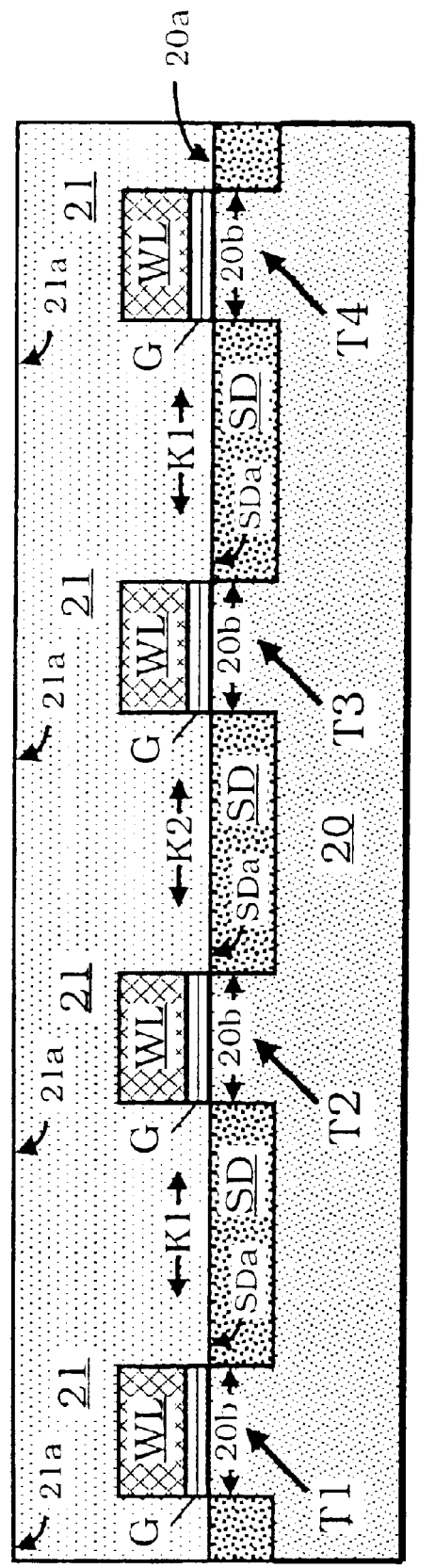
FIGS. 1–7 are diagrammatic sectional side views of different intermediate stages during fabrication of a semiconductor memory device in accordance with an exemplary mode of the method according to the invention.

A starting point for the fabrication of the semiconductor memory device 1 according to the invention is the configuration shown in lateral cross-sectional view in FIG. 1. In an actual semiconductor substrate 20, a CMOS structure which serves for the interconnection of the semiconductor memory device is formed in a preliminary process. In a surface region 20a of the semiconductor substrate 20, selection transistor devices T1 to T4 are provided for the selection of the memory cells to be formed, i.e. for the driving of the storage capacitors 10-1, . . . , 10-4 that are to be correspondingly formed. The selection transistor devices are formed by source/drain regions SD with corresponding surface regions SDa that are arranged in the surface region 20a of the semiconductor substrate 20. In this case, adjacent source/drain regions SD are arranged spaced apart from one another and are separated from one another by an intermediate region 20b in the surface region 20a of the semiconductor substrate 20.

Essentially electrically conductive word lines WL that are electrically insulated through the use of gate oxide regions G run above the intermediate regions 20b in the surface region 20a of the semiconductor substrate 20. The gate oxide regions G of the individual selection transistor devices T1 to T4 are driven via the word lines WL, the gate oxide regions thereby functioning as gate. The electrical contact connection of the word lines is not explicitly illustrated.

Within the context of an essentially anisotropic etching process in conjunction with a lithography step, a plurality of first and second cutouts are formed in the first passivation region 21, to be precise at defined first locations K1 and also at defined second locations K2. These defined locations K1 and K2 are situated in the region above the source/drain regions SD of the selection transistor devices T1, . . . , T4 of the underlying CMOS structure.

The first and second cutouts at the first and second locations K1 and K2 extend in a vertical direction, proceeding from the surface 21a of the first passivation region 21, as far as the level of the surface region 20a of the semiconductor substrate and, in particular, as far as the level of the surface region SDa of the source/drain regions SD of the selection transistor devices T1, . . . , T4.

Figure 2:
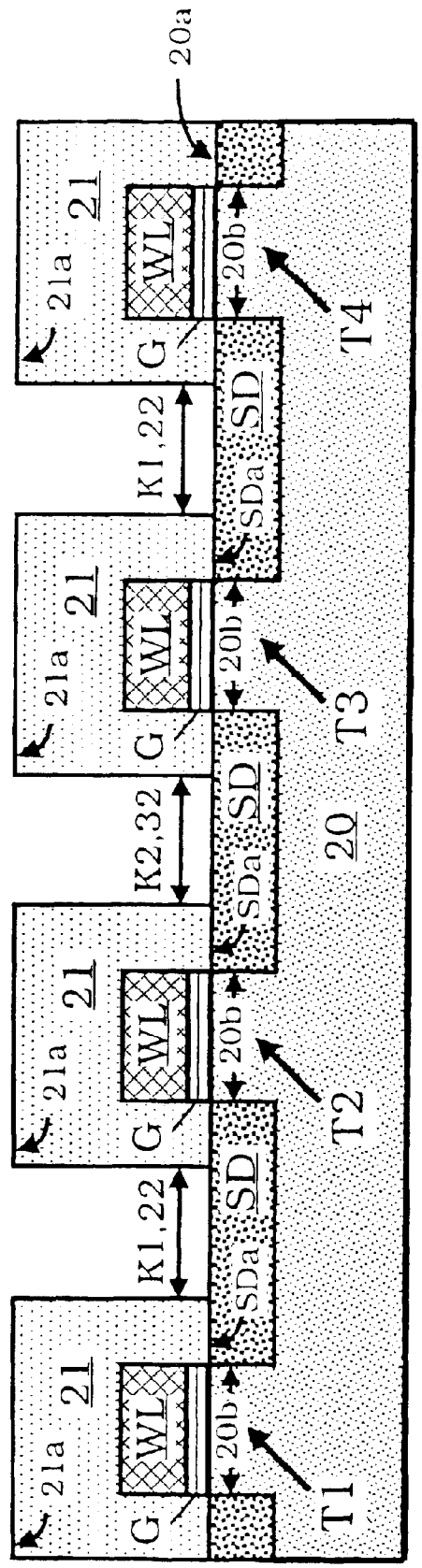

The first and second cutouts 22 and 32 formed in the first passivation region 21 are illustrated in lateral cross-sectional view in FIG. 2.

A material region 28 for the first and second plug regions P1 and P2 that are to be formed is then formed in the context of a 2D deposition method. The first and second cutouts 22 and 32 in the first passivation region 21 are completely filled in this case. The surface region 21a of the first passivation region 21 is also covered with the material region 28 for the first and second plug regions P1 and P2, as is shown in FIG. 3.

Figure 3:
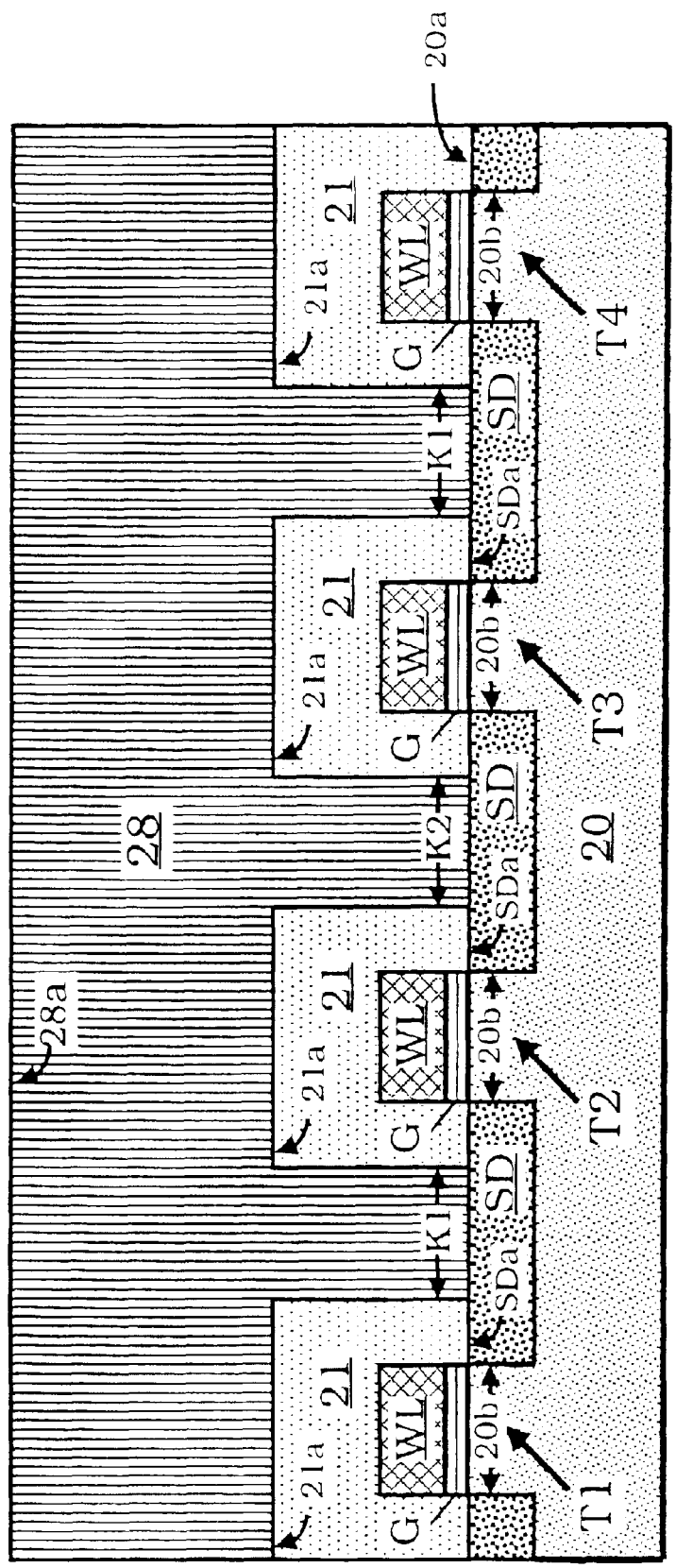
Figure 4:
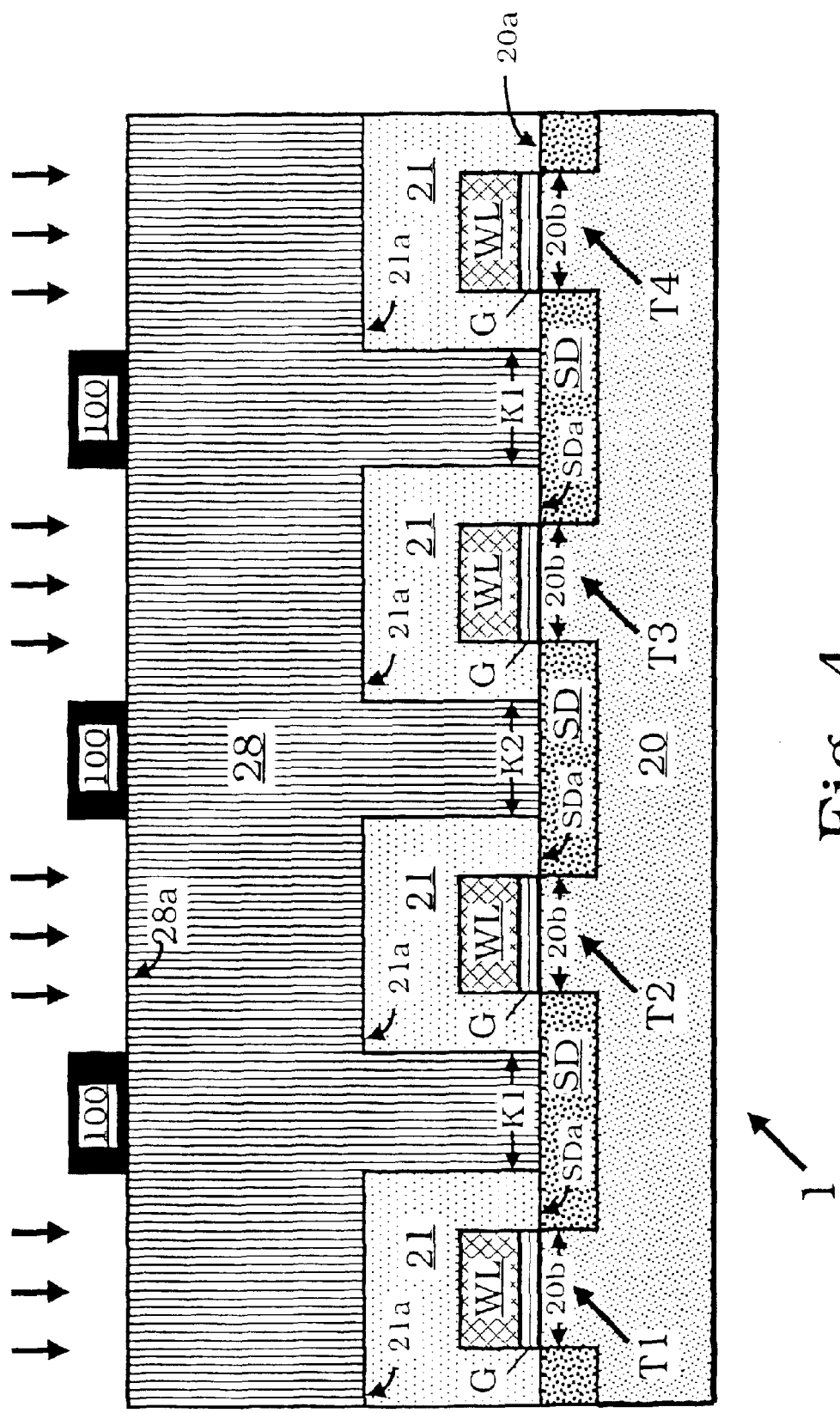

Proceeding from the structure shown in lateral cross-sectional view in FIG. 3, the further procedure according to the invention is as follows in order to form a semiconductor memory device in an advantageous manner with particularly few process steps:

FIG. 4 shows, in lateral cross-sectional view, an intermediate state in which a mask structure 100 is prescribed on the planar surface 28a of the configuration of FIG. 3.

Figure 5:
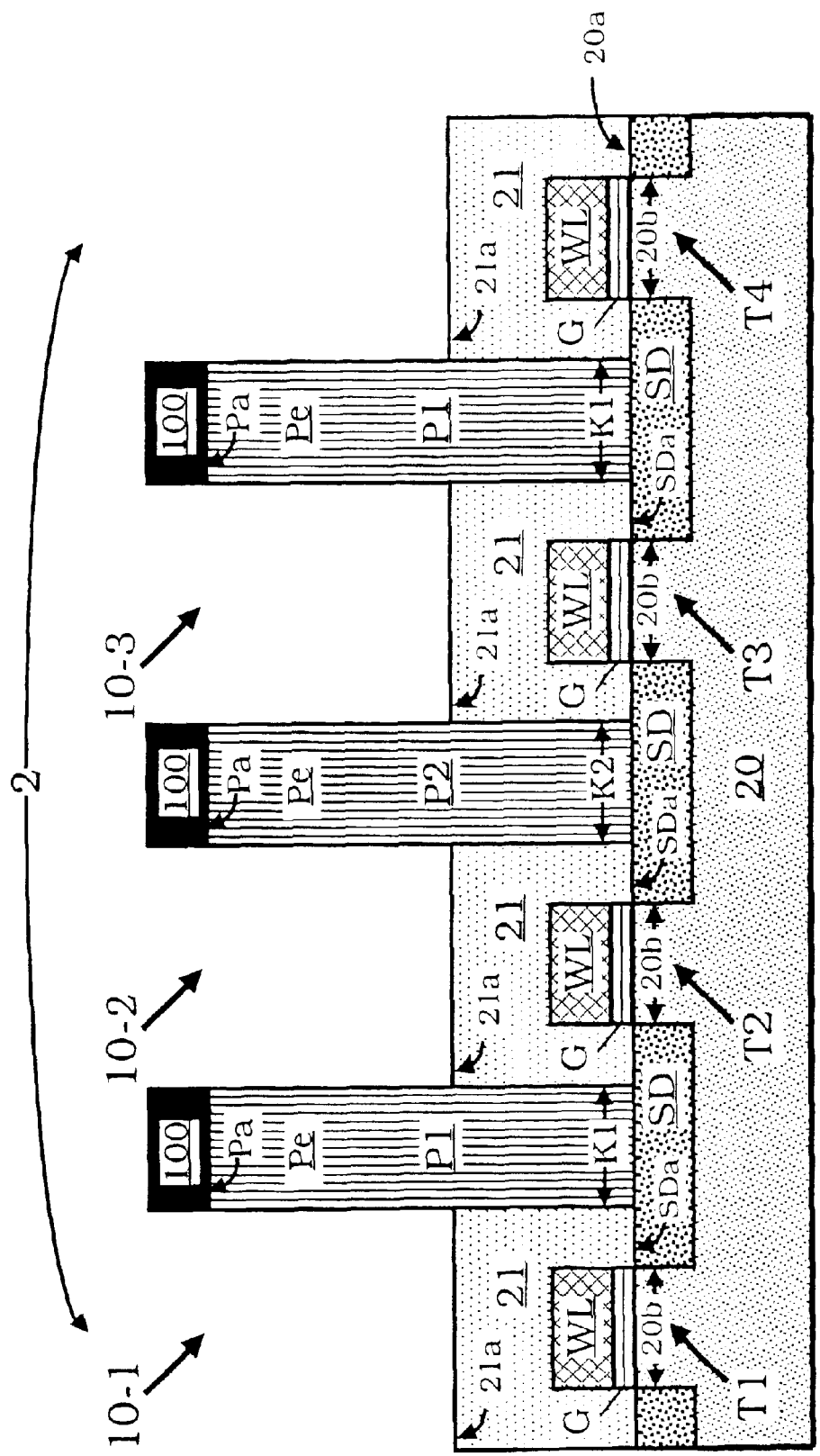

The first and second plug regions P1 and P2 are then formed with a correspondingly elevated region Pe below the masks 100 in a common etching-back step, as is shown in FIG. 5.

Figure 6:
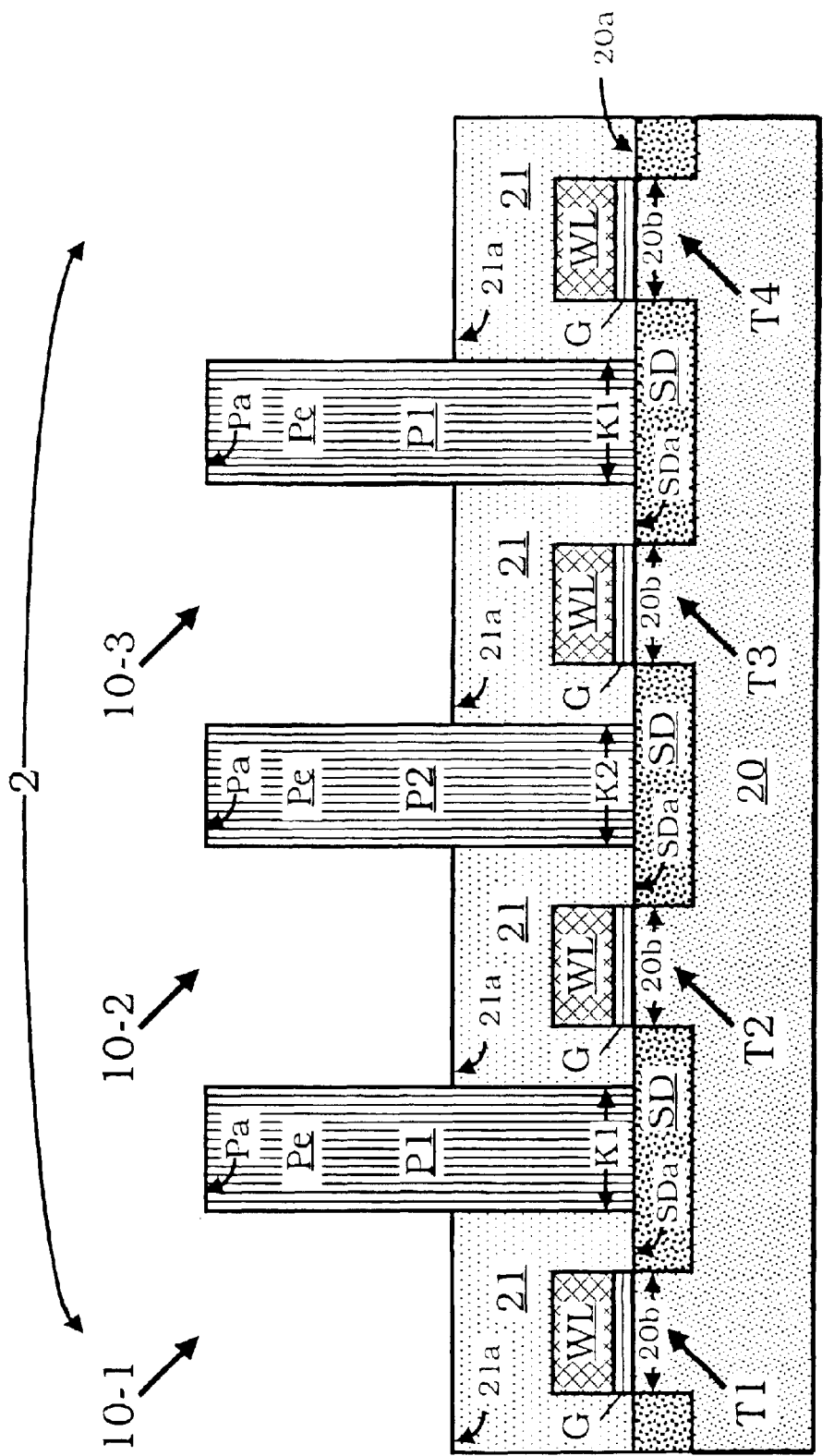

In the transition to the state of FIG. 6, the masks 100 are then removed from the plug surfaces Pa of the elevated regions Pe of the first and second plugs P1 and P2 through the use of a corresponding cleaning or etching step, as is shown in FIG. 6.

Figure 7:
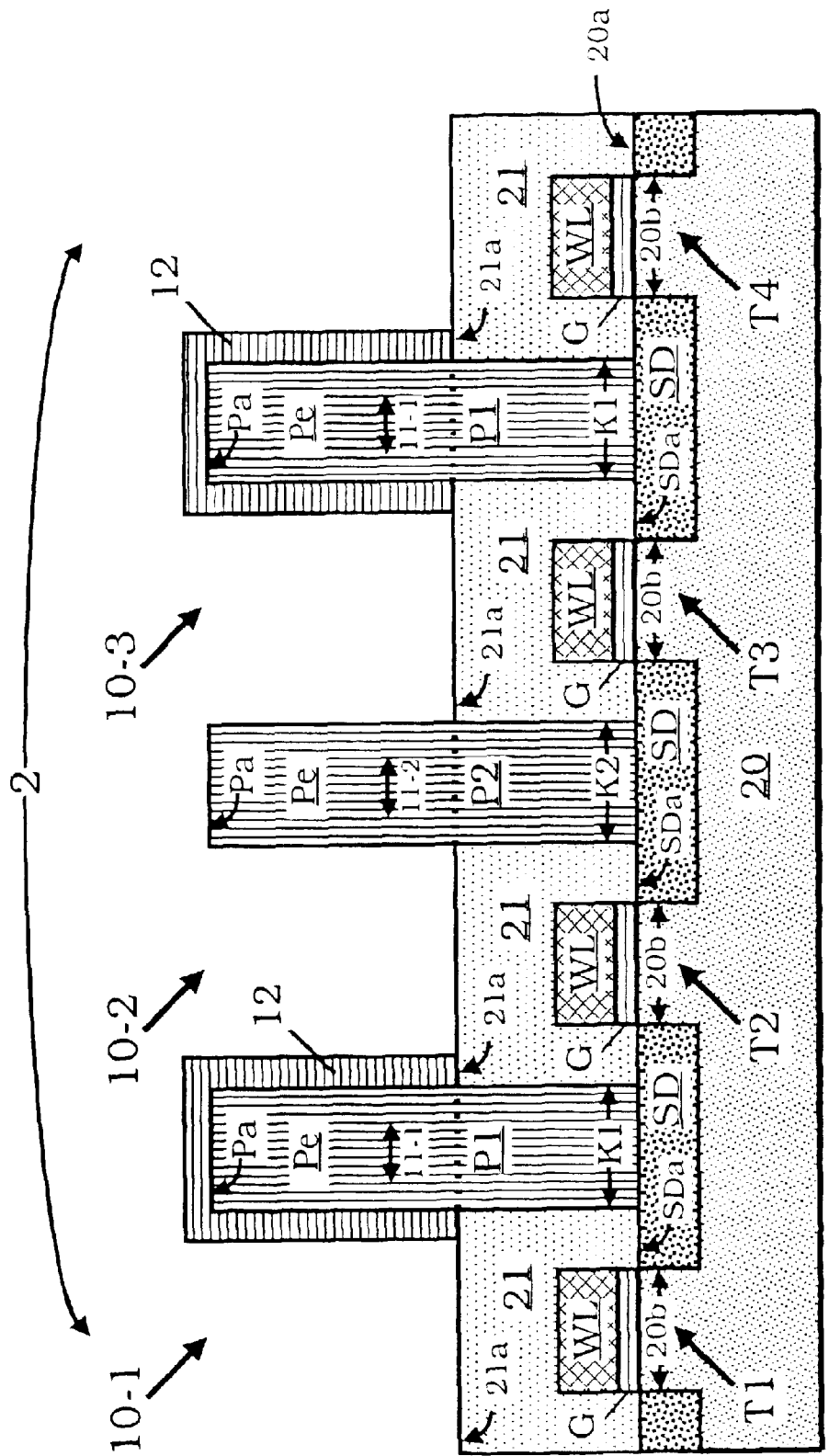

Then, in the transition to the state of FIG. 7, the first plugs P1 are in this case covered, in this exemplary embodiment, with an oxygen barrier 12 in a conformal manner.

Figure 8:
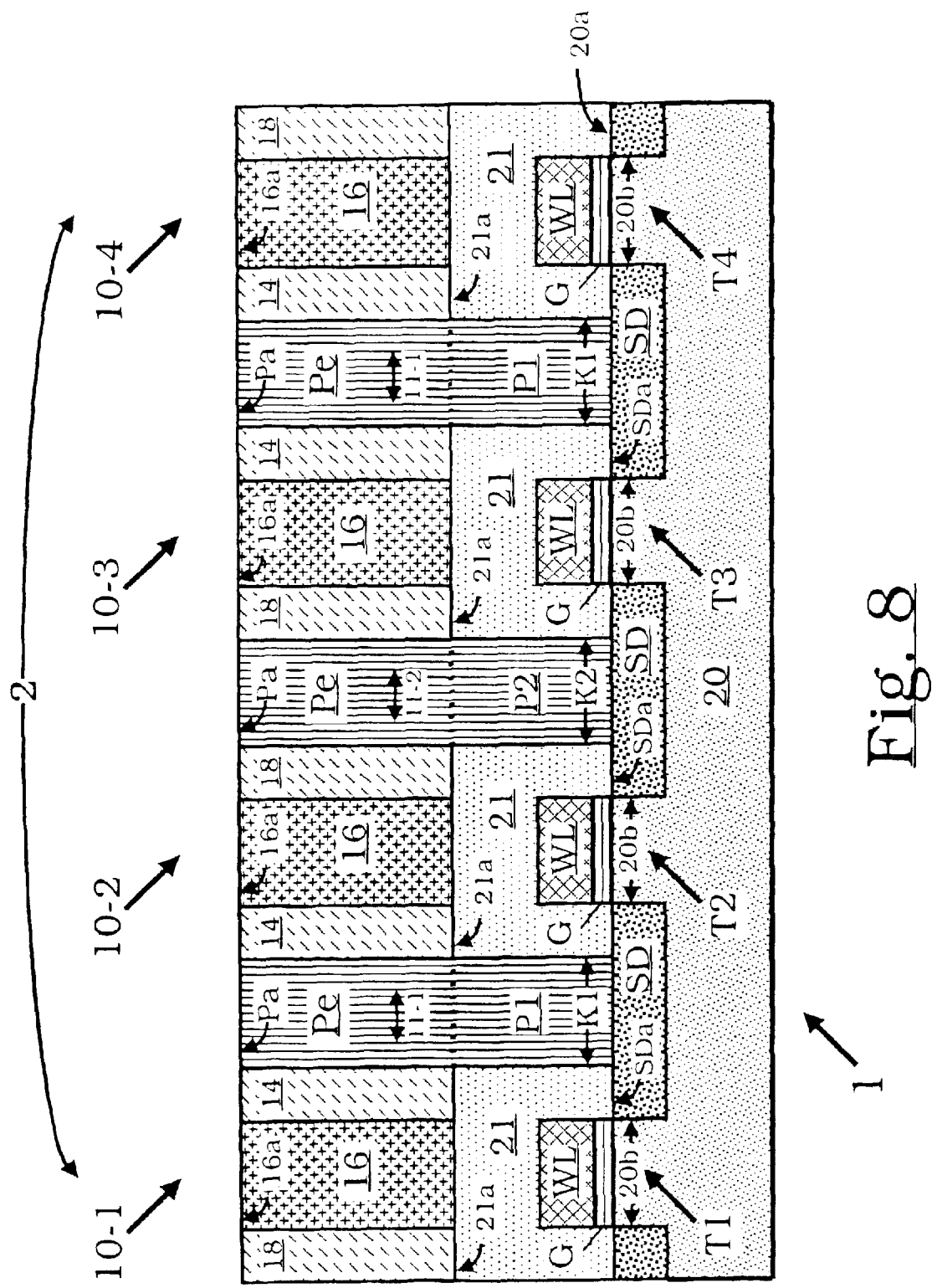
FIG. 8 is a diagrammatic sectional side view of an exemplary semiconductor memory structure fabricated in accordance with an exemplary mode of the method according to the invention.

FIG. 8 shows, following an application example, in lateral cross-sectional view, the result of the application of one embodiment of the method according to the invention for fabricating a semiconductor memory device, a semiconductor memory device 1 or an intermediate state thereof being produced in which the storage capacitors 10-1 to 10-4 extend essentially vertically and form a connected or chain structure.

In this case, the first and second contact regions or plug regions P1 and P2 extend at first and second defined locations or regions K1 and K2 directly above source/drain regions SD of the underlying CMOS structure in the surface region 20a of the actual semiconductor substrate 20.

In this case, the first and second plug regions P1 and P2 contact-connect the surface regions SDa of the source/drain regions of the selection transistors T1 to T4 to first and second electrode devices 14 and 18, respectively, of the capacitor configuration 2 of the plurality of capacitor devices 10-1 to 10-4. Pairs of adjacent first electrode devices 14 and second electrode devices 18 are in each case electrically conductively connected to one another and to the underlying source/drain region SD via the elevated regions Pe of the first and second plugs P1 and P2. The elevated regions Pe thus function as connecting elements 11-1 and 11-2 of the first electrode devices 14 and of the second electrode devices 18 of the capacitor devices 10-1 to 10-4.

A dielectric region 16 is in each case formed between the adjacent first and second electrode devices 14 and 18, which dielectric region may, for example, include a ferroelectric or a paraelectric.

We claim:

1. A method for fabricating a semiconductor memory device, the method which comprises:

forming a CMOS structure in at least one region selected from the group consisting of a semiconductor substrate region, a passivation region, a surface region of the semiconductor substrate region and a surface region of the passivation region;

forming a capacitor configuration in at least one region selected from the group consisting of the semiconductor substrate region, the passivation region, the surface region of the semiconductor substrate region and the surface region of the passivation region such that the capacitor configuration includes a plurality of capacitor devices serving as storage elements;

providing at least first and second contact regions for contacting the capacitor devices to the CMOS structure;

forming a first electrode device as a bottom electrode device, a second electrode device as a top electrode device and a dielectric between the first electrode device and the second electrode device for each of the capacitor devices; and forming at least some of the first and second contact regions with respective elevated regions in the passivation region such that the elevated regions are elevated above the surface region of the passivation region.

2. The method according to claim 1, which comprises providing the at least first and second contact regions as plug regions.

3. The method according to claim 1, which comprises forming the first and second contact regions together in a common process step.

4. The method according to claim 1, which comprises forming the first and second contact regions together in a common cascaded process sequence.

5. The method according to claim 1, which comprises forming at least one of the first and second contact regions after forming the passivation region.

6. The method according to claim 1, which comprises forming the elevated regions of the at least some of the first and second contact regions by performing a selective masking and by etching back at least one of the passivation region and the at least some of the first and second contact regions provided in the passivation region.

7. The method according to claim 1, which comprises at least partially covering the CMOS structure and at least partially covering one of the semiconductor substrate region extending substantially horizontally and the surface region of the semiconductor substrate region with at least the passivation region formed of an electrically insulating material having a planar surface region such that the passivation region extends laterally in a substantially two-dimensional manner over a given area.

8. The method according to claim 1, which comprises at least partially covering the CMOS structure and at least partially covering one of the semiconductor substrate region extending substantially horizontally and the surface region of the semiconductor substrate region with at least the passivation region formed of an electrically insulating material having a planar surface region such that the passivation region extends laterally in a substantially two-dimensional manner substantially entirely over the semiconductor substrate region.

9. The method according to claim 1, which comprises at least partially embedding the CMOS structure and at least partially embedding one of the semiconductor substrate region extending substantially horizontally and the surface region of the semiconductor substrate region with at least the passivation region formed of an electrically insulating material having a planar surface region such that the passivation region extends laterally in a substantially two-dimensional manner over a given area.

10. The method according to claim 1, which comprises at least partially embedding the CMOS structure and at least partially embedding one of the semiconductor substrate region extending substantially horizontally and the surface region of the semiconductor substrate region with at least the passivation region formed of an electrically insulating material having a planar surface region such that the passivation region extends laterally in a substantially two-dimensional manner substantially entirely over the semiconductor substrate region.

11. The method according to claim 1, which comprises:
providing the passivation region such that the passivation region extends laterally in a substantially two-dimensional manner over the CMOS structure; and
forming first and second cutouts for forming the first and second contact regions in given first and second regions in the passivation region by using a selective and common etching process.

12. The method according to claim 11, which comprises providing the first and second regions as first and second locations.

13. The method according to claim 11, which comprises selecting, as the first and second regions, regions above source/drain regions of selection transistor devices of the CMOS structure, the selection transistor devices being provided in the surface region of the semiconductor substrate region.

14. The method according to claim 13, which comprises forming the first and second cutouts vertically at least partially as far as a level of surface regions of the source/drain regions of the selection transistor devices.

15. The method according to claim 14, which comprises forming the first and second contact regions by providing a first material region of an electrically conductive material such that the first material region is formed as a substantially two-dimensional conformal layer covering at least a given area and filling the first and second cutouts in each case as far as the level of the surface regions of the source/drain regions and by subsequently polishing as far as a level of the surface region of the passivation region.

16. The method according to claim 1, which comprises forming the first and second contact regions substantially identically.

17. The method according to claim 1, which comprises providing the capacitor configuration as an at least partially connected structure by forming at least some of the capacitor devices such that the first electrode device of a first one of the capacitor devices contacts, via a first contact element, the first electrode device of a second one of the capacitor devices disposed spatially directly adjacent to the first one of the capacitor devices, and such that the second electrode device of the first one of the capacitor devices contacts, via a second contact element, the second electrode device of the second one of the capacitor devices disposed spatially directly adjacent to the first one of the capacitor devices.

18. The method according to claim 1, which comprises providing the capacitor configuration as a chain structure by forming at least some of the capacitor devices such that the first electrode device of a first one of the capacitor devices contacts, via a first contact element, the first electrode device of a second one of the capacitor devices disposed spatially directly adjacent to the first one of the capacitor devices, and such that the second electrode device of the first one of the capacitor devices contacts, via a second contact element, the second electrode device of the second one of the capacitor devices disposed spatially directly adjacent to the first one of the capacitor devices.

19. The method according to claim 1, which comprises constructing at least some of the capacitor devices with a stacked structure.

20. The method according to claim 1, which comprises one of forming and patterning the capacitor devices in each case in an at least one of partially vertically and locally vertically extending manner with respect to at least one region selected from the group consisting of the semiconductor substrate region, the passivation region, the surface region of the semiconductor substrate region and the surface region of the passivation region such that for a respective one of the capacitor devices one of a three-dimensional configuration and a configuration extending at least one of partially and locally into a third dimension with respect to a given region extending substantially in a first and a second dimension is formed, the given region being selected from the group consisting of the semiconductor substrate region, the passivation region, the surface region of the semiconductor substrate region and the surface region of the passivation region.

21. The method according to claim 1, which comprises forming the first and second electrode devices and the dielectric of a respective one of the capacitor devices in each case in an at least one of partially vertically and locally vertically extending manner with respect to at least one region selected from the group consisting of the semiconductor substrate region, the passivation region, the surface region of the semiconductor substrate region and the surface region of the passivation region such that a sequence of the first electrode device, the dielectric and the second electrode device of the respective one of the capacitor devices is formed in one of an at least partially and locally horizontally extending manner with respect to at least one region selected from the group consisting of the semiconductor substrate region, the passivation region, the surface region of the semiconductor substrate region and the surface region of the passivation region and such that the first electrode device, the dielectric and the second electrode device of the respective one of the capacitor devices are disposed next to one another in a surface region selected from the group consisting of the surface region of the semiconductor substrate region and the surface region of the passivation region.

22. The method according to claim 1, which comprises forming at least those of the at least first and second contact regions, that are to be contact-connected to the second electrode device, with the elevated regions.

23. The method according to claim 1, which comprises forming at least the second contact regions, that are to be contact-connected to the second electrode device, with the elevated regions.

24. The method according to claim 1, which comprises forming electrically conductive barrier regions at least on parts of at least some of the first and second contact regions formed with the elevated regions in order at least to reduce a diffusion of ambient elements to respective ones of the first and second contact regions during one of an operation and a processing.

25. The method according to claim 1, which comprises forming electrically conductive barrier regions at least on parts of the first contact regions formed with the elevated regions and to be contact-connected to the first electrode device in order at least to reduce a diffusion of ambient elements to respective ones of the first contact regions during one of an operation and a processing.

* * * * *